United States Patent [19]

Stengl et al.

[11] Patent Number: 5,801,388

[45] Date of Patent: Sep. 1, 1998

[54] PARTICLE BEAM, IN PARTICULAR IONIC OPTIC IMAGING SYSTEM

[75] Inventors: Gerhard Stengl, Wernberg; Alfred Chalupka, Vienna; Herbert Vonach, Klosterneuburg, all of Austria

[73] Assignee: IMS-Ionen Mikropfabrikations Systeme GmbH, Vienna, Austria

[21] Appl. No.: 669,481

[22] PCT Filed: Jan. 12, 1995

[86] PCT No.: PCT/AT95/00003

§ 371 Date: Sep. 17, 1996

§ 102(e) Date: Sep. 17, 1996

[87] PCT Pub. No.: WO95/19637

PCT Pub. Date: Jul. 20, 1995

[30] Foreign Application Priority Data

Jan. 13, 1994 [AT] Austria ................... A 47/94

[51] Int. Cl.[6] .................................................. H01J 37/30
[52] U.S. Cl. .......................... 250/492.21; 250/398
[58] Field of Search ............... 250/492.21, 492.2, 250/398, 396 R, 492.3

[56] References Cited

U.S. PATENT DOCUMENTS

| | | | |
|---|---|---|---|
| 5,350,924 | 9/1994 | Stengl et al. | 250/492.2 |
| 5,378,917 | 1/1995 | Chalupka et al. | 250/492.21 |
| 5,436,460 | 7/1995 | Stengl et al. | 250/492.21 |
| 5,637,879 | 6/1997 | Schueler | 250/492.21 |

FOREIGN PATENT DOCUMENTS

| | | |
|---|---|---|
| 0 344 646 | 12/1989 | European Pat. Off. |
| 0 523 033 | 1/1993 | European Pat. Off. |
| 0 564 438 | 10/1993 | European Pat. Off. |

OTHER PUBLICATIONS

Chalupka et al. "Novel electrostatic column for ion projection lithography" Journal of Vacuum Science & Technology B, Aug. 12, 1994, pp. 3513–3517.

Weidenhausen et al., Stochastic Ray Deflections In Focused Charged Particle Beams, Optik 69, No. 3 (1985) 126–134.

*Primary Examiner*—Kiet T. Nguyen
*Attorney, Agent, or Firm*—Kenyon & Kenyon

[57] ABSTRACT

A particle beam, in particular in ionic on the reproduction system, preferably for lithographic purposes, has a particle source, in particular an ion source for reproducing on a wafer a structure designed in a masking foil as one or several transparent spots, in particular openings, through at least two electrostatic lenses arranged upstream of the wafer. One of the lenses is a grating lens constituted by one or two tubular electrodes and by a perforated plate arranged in the path of the beam perpendicularly to the optical axis. The plate is formed by a masking foil which forms the central or first electrode of the granting lens, in the direction of propagation of the beam.

11 Claims, 7 Drawing Sheets

PARTICLE BEAM, IN PARTICULAR IONIC OPTIC IMAGING SYSTEM

FIELD OF THE INVENTION

The present invention relates to a particle beam imaging system, and in particular, an ionic optic imaging system.

BACKGROUND INFORMATION

The lithographic step is especially important amongst the different steps which must be carried out to produce semiconductor elements. Each lithographic step commences with the application of a thin sheet of light-sensitive (or particle beam sensitive) material, the so-called photo-resist or for short "resist" onto a wafer made in particular from silicium. A lithographic device then projects the structure present on a mask in the form of one or several transparent spots onto the wafer provided with the resist. Where appropriate, optical elements are located between the mask and the wafer. The expansion of the projected structure of the mask on the wafer is mostly much smaller than the wafer. After the projection process, the wafer is displaced and the same structure of the mask is projected to a different spot on the wafer. This process of projection and displacement is repeated again and again until the entire wafer surface has been covered. By virtue of the subsequent development of the resist, the desired sample for example in the form of resist-free spots is obtained on the wafer. The wafer can then be subjected in further steps to any of the known treatment procedures, such as etching, ion implantation or application and diffusion of doping material. The wafer is checked after these further steps, coated again with resist and the entire aforementioned step sequence repeated approximately 10–20 times, until finally a chess board-type arrangement of identical microcircuits is produced on the wafer.

Most of the conventional projection lithographic methods employ light to irradiate the resist but the requirement for smaller structures and higher densities of the components of the microcircuits has lead to an intensive search for other irradiation methods which in their resolution are not limited as is the case when employing light owing to its relatively long wave length. Great efforts have been undertaken to use X-ray beams in lithographic devices, whereas other methods such as for example the particle beam, in particular ion beam lithography have in fact been awarded some but considerably less consideration.

For a particle beam, and in particular ionic optic imaging systems, preferably for lithographic purposes, comprising a particle source, in particular an ion source, for the purpose of imaging onto the wafer a structure located on a mask in the form of one or a plurality of holes by way of at least two collecting lenses located between the mask and a wafer, it has already been proposed in European Patent Application No. 93 890 058.6 to design at least one of the collecting lenses as a so-called three electrode grating lens which consists of two tube electrodes. Between the electrodes is located a third electrode which is designed as a plate comprising a plurality of holes, preferably as a grating, wherein the plate, more specifically the grating, is arranged perpendicular to the optical axis, so that by virtue of the plate, i.e. the grating, the lens is divided into two regions, wherein it is preferable to provide different voltages at the three electrodes. One of the lens regions of the three electrode grating lens having a grating as the middle electrode can have a positive refractive power, the second lens region however can have a negative refractive power, wherein the absolute value of the refractive power of the lens region having the negative refractive power (the dispersing region) is lower that the refractive power of the lens region having the positive refractive power (collecting region). In the case of an imaging system of this type, it is possible despite the different absolute amounts of the refractive powers for the image distortion coefficients to be compensated to a great extent if the dispersing region comprising corresponding greater image distortions of the 3rd order than the collecting region.

The use of a three-electrode grating lens thus renders it possible in each case to cause one image distortion coefficient to disappear into the imaging equations of this lens, wherein also the remaining image distortion coefficients assume small values in comparison to the electrostatic lenses described for example from the European Patent Application Nos. EP-89109553, EP-92890165, and EP-9280181. This is achieved by introducing the plate or rather grating electrode since only this type of electrode renders it possible to produce an electrostatic diverging lens. In addition thereto, in ionic optic lithography systems having three electrode grating lenses the resulting distortion is also reduced at the site of the minimum distortion. The use of the three electrode lenses with grating as the middle electrode moreover renders it possible to reduce the distance mask-wafer with respect to known systems if the distortion values are related to identical image field sizes. Finally, the intensity of the sharpness of the imaging system is substantially increased because the three-electrode lenses with a grating as the middle electrode comprise in each case only extremely small image distortions and therefore the compensation of the image distortion in the case of the lens being located between the wafer and mask is less critical.

Essentially, this effect can be achieved if the sequence of diverging and collecting lenses is reversed, i.e. if for example the electrode designed as a grating forms the first electrode of a diverging two-electrode grating lens, followed for example by a collecting lens in the form of a field lens. The term 'field lens' or 'immersion lens' refers in this case to an arrangement of two coaxial, rotationally symmetrical electrodes (e.g, tubular electrodes) which are located on different potentials.

Interference caused by the holes in the plate or rather by the holes in the grating can be avoided, if on the one hand the grating holes and their spacing are maintained extremely small (in the order of micrometers) and if the field intensities on both sides of the grating in the region of the illumination by the ion beams are as identical as possible.

The problem when using gratings resides in the fact that, owing to the fine holes and cross pieces, the grating must be extremely thin yet cover a relatively large area and therefore is extremely sensitive to damage, so that constant monitoring is required both with respect to the manufacturing process and also during its period of use in the lens. For this purpose, the grating must be removed from the machine, where necessary cleaned and reinstalled in position, wherein each time owing to its fragility there is the risk of it being damaged or destroyed.

SUMMARY OF THE INVENTION

The object of the present invention is therefore to obviate this problem. To this end, the present invention describes design of a particle beam, in particular ionic optic imaging system, preferably for lithography purposes, having a particle source, in particular an ion source for imaging onto the wafer a structure located on a masking foil in the form of one or a plurality of transparent spots, more specifically holes, by way of at least two electrostatic lenses arranged in the beam direction in front of a wafer, wherein at least one of the lenses is a so-called grating lens formed by one or two tube electrodes and a plate which comprises holes and is arranged in the beam path, wherein the plate is arranged perpendicular with respect to the optical axis, that according to the present invention the plate is formed by the masking foil which forms the middle or as seen in the beam direction the first electrode of the grating lens. In each case the mask together with the following electrode as seen in the ion beam direction forms a diverging lens whose image distortions of the 3rd order are compensated to a minimal residual value by the following collecting lens(es).

By replacing the grating of the conventional design with the mask only one of the elements provided requires maximum precision during its manufacture and use, namely the mask itself, which even in the case of all other embodiments is to be manufactured with an equally high amount of precision, however, the other element which is likewise to be manufactured with a high amount of precision is omitted and the defects which cause the inadequacies of these second elements are avoided.

In a further embodiment of the present invention the ionic optic imaging system, in which the mask represents the middle electrode of a three electrode grating lens, comprises as a further imaging element a collecting lens in the form of a field lens or an asymmetrical single lens. The asymmetrical single lens in this case is understood to be a three-electrode lens, wherein all electrodes are located on different potentials. Asymmetric single lenses are used because they have considerably less image distortion than immersion lenses with equivalent imaging characteristics.

In the three-electrode grating lens, whose middle electrode is now the mask, the first region represents practically the illuminating lens for the mask and the second region represents the diverging lens (negative refractive power) whose distortion is to a great extent compensated by the lens following on in the beam path.

In a further embodiment, wherein the mask forms the first electrode of a two-electrode grating lens, following on from this lens in the beam path are a field lens and then an asymmetric single lens. In this case the image distortion of the last lens in front of the wafer is compensated by the distortion of the diverging lens comprising the mask and by the lens following.

Owing to the fact that the mask is now placed at the site where in the conventional design (European Patent Application No. 93 890 058.6) the grating was located, the grating plane has now become the object plane. The holes in the mask form the aperture lenses, as did the holes in the grating in the conventional design. Since, however, the mask is now the object to be imaged, which will be imaged in the image plane, according to the Laws of Optics a small change in the angle of the particles issuing from the mask holes is to a great extent to be disregarded in the effect on the imaging since all particles emitted from an object point are collected in one image point.

In a further embodiment of this type of design according to the present invention, in which the mask forms the first electrode of a two-electrode grating lens, the cross-over point of the beams ("cross-over") lies in the field-free space in the beam direction in front of the last lens before the wafer, i.e between the field lens and the asymmetric single lens. It is possible in a further embodiment of the present invention to provide that the field lens accelerates the ions to an energy which is sufficiently high that the so-called stochastic space charge effect, as described herein, are minimized. In the asymmetric single lens the energy of the ions can if necessary be reduced to the energy required at the wafer.

DETAILED DESCRIPTION OF THE INVENTION

Figure 1A:
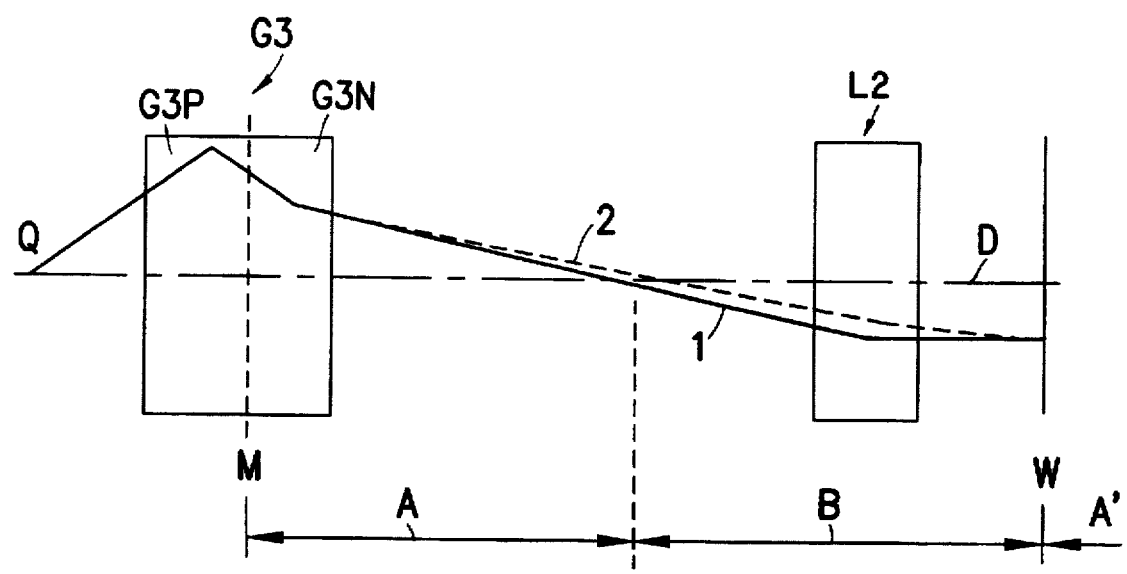
FIG. 1a shows a schematic and lateral view of the structure and beam path of an ion lithography system of a first embodiment with a crossover point, with distortion correction, according to the present invention.
Figure 1B:
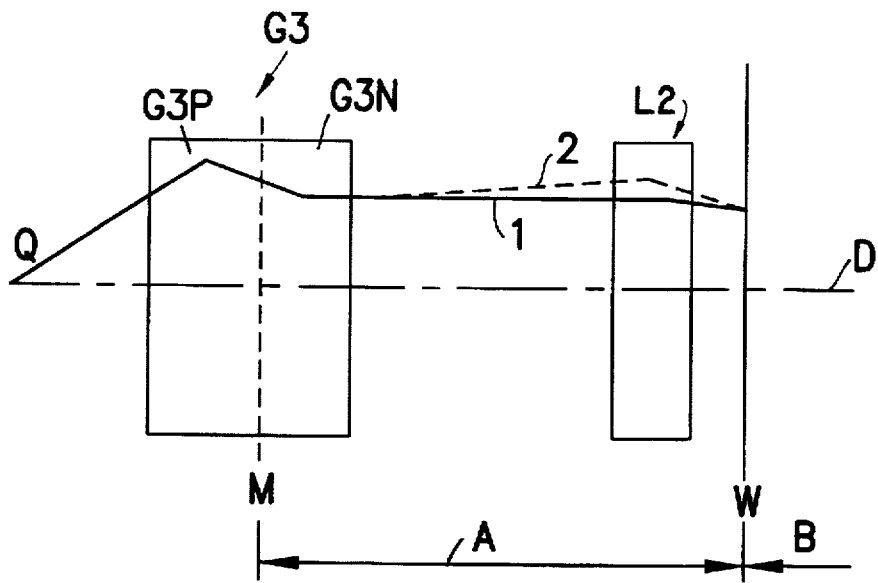
FIG. 1b shows the analogue view of the first embodiment according to the present invention without a cross-over point.

According to FIGS. 1a and 1b the ionic optic imaging system comprises an ion source Q for the purpose of imaging a structure located on a mask M onto a wafer W. The structure is present as at least one hole on the mask M. In the first embodiment according to the present invention, two of the electrodes, as illustrated in more detail in FIG. 4 and FIG. 5, as tube electrodes R1 and R2 and the third electrode arranged between these tube electrodes R1 and R2 is formed by the mask M. The mask M is arranged perpendicular to the optical axis D of the imaging system and divides the lens L1 into two regions P and N. Different potentials U1, U2 and U3 lie at the three electrodes, namely the two tube electrodes R1 and R2 and the electrode formed by the mask M, the desired beam is designated 1 in the drawing and the actual beam is designated 2.

In the example described, the lens region P has a positive refractive power and the lens region N a negative refractive power, wherein however the absolute amount of the refractive power of the lens region N having the negative refractive power is less than the refractive power of the lens region P having the positive refractive power so that the total refractive power of the three-electrode lens G3 is positive.

Figure 4:
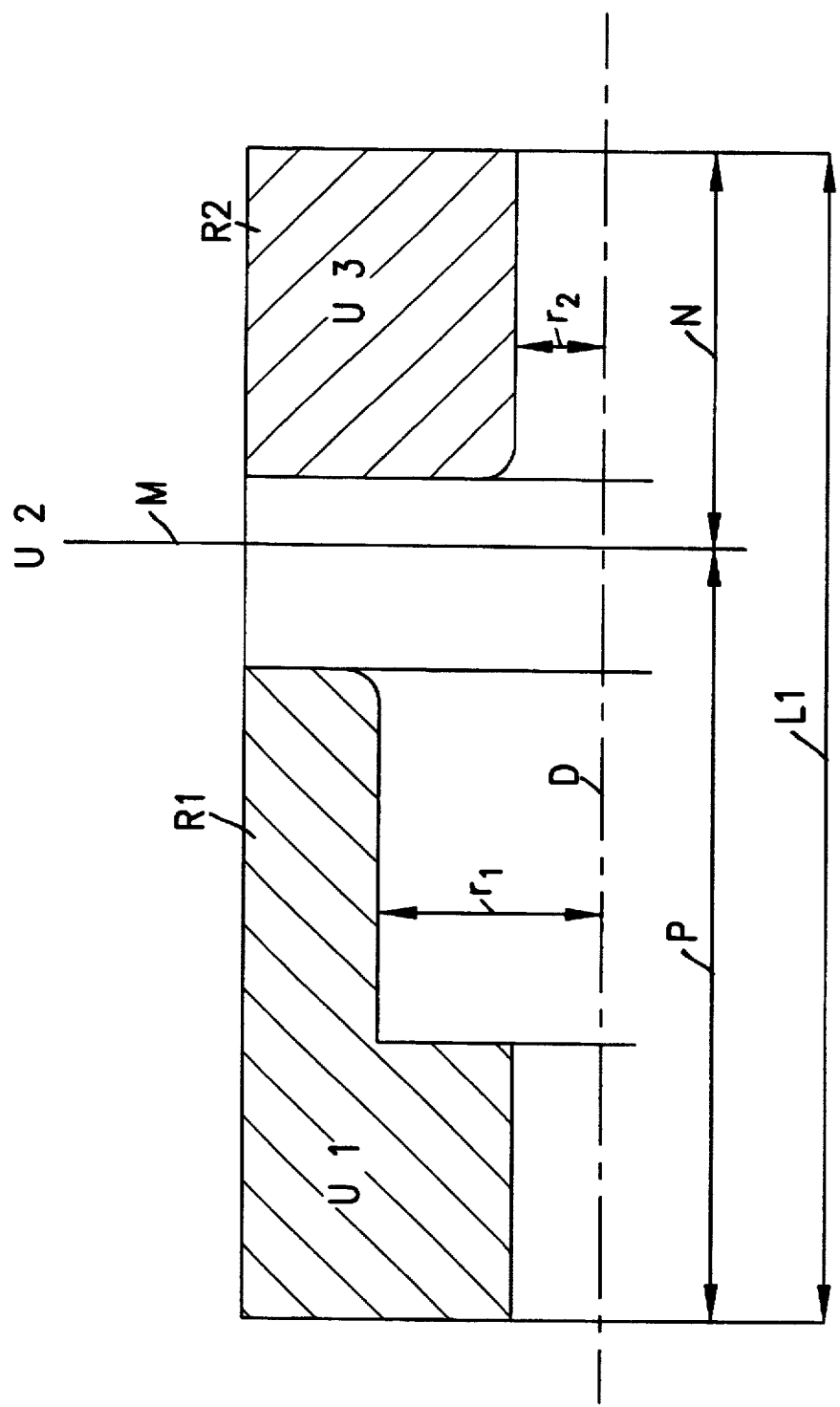
FIG. 4 shows a lens according to the present invention comprising three electrodes in the axial longitudinal sectional view, wherein the middle electrode is formed by a mask according to the present invention.
Figure 5:
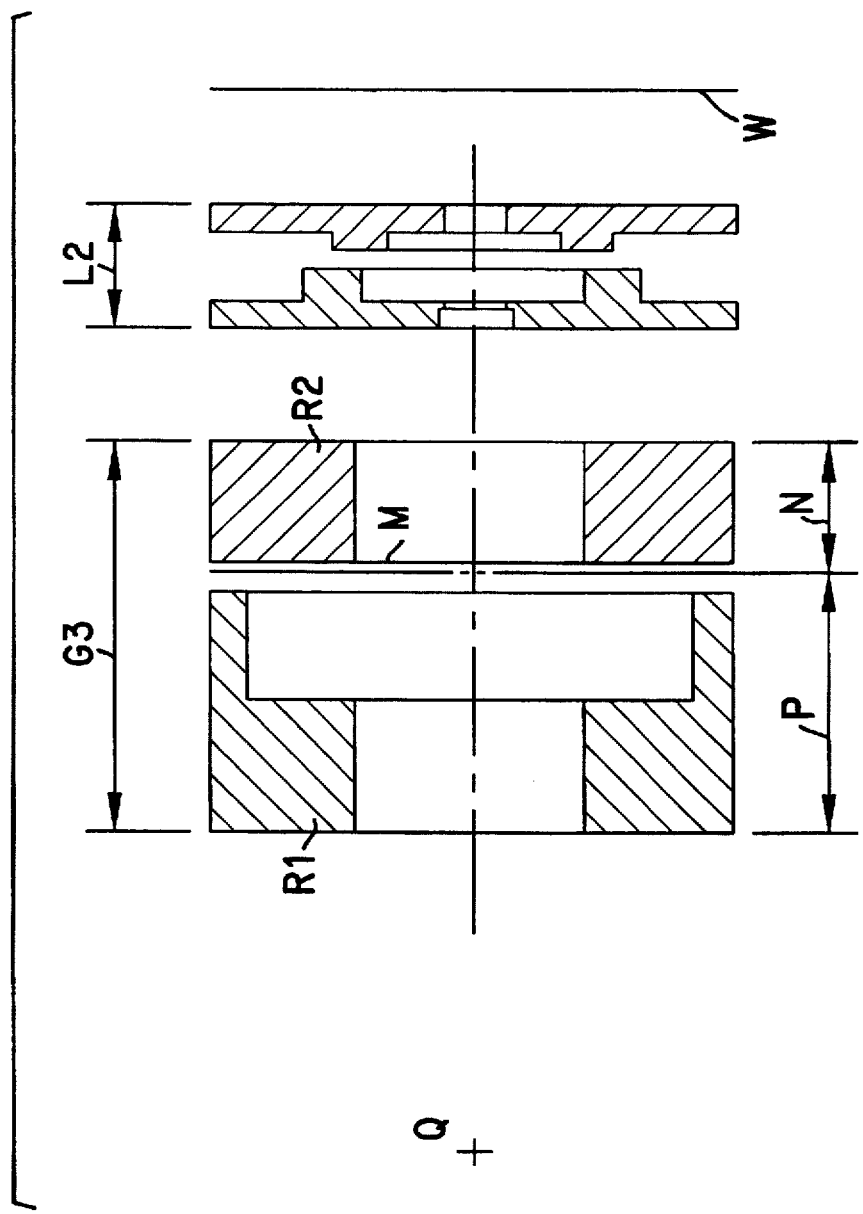
FIG. 5 shows a combination of a collecting lens as shown in FIG. 4 in the axial longitudinal sectional view with a further lens in the form of a field lens arranged in front of the wafer.

It is further evident from FIG. 4 and FIG. 5, that the tube electrode R2 of the lens region N having the negative refractive power has a smaller diameter (approximately half the size) than the part facing the mask of the tube electrode R1 of the lens region P having the positive refractive power. The voltage ratio (U3-U0)/(U2-U0) between the electrodes of the lens region N having the negative refractive power is likewise smaller (approximately one third) than the voltage ratio (U3-U0)/U2-U0) between the electrodes of the lens region P having the positive refractive power, wherein U0 is the potential at which the kinetic energy of the charged particles employed would be zero.

Endeavours are made to provide at both sides of the mask M field intensities which are as identical as possible for each region which is illuminated by the beam of ion rays.

In the three-electrode grating lens which now comprises the mask as the grating, the first region represents practically the illuminating lens for the mask and the second region represents the diverging lens (negative refractive power) whose distortion is to a great extent compensated by the following collecting lens L2. Owing to the fact that the mask is now located at the site where in the conventional design (European Patent Application No. 93 890 058.6) the grating was located, the grating plane now becomes the object plane. The holes in the mask form practically the holes of the grating, wherein the mask holes have the same effect as the aperture lenses of the grating holes. Since, however, as already mentioned, the mask M is now the object to be imaged in the optical column, which object will be imaged in the image plane, according to the Laws of Optics a small change in the angle of the particles issuing from the mask holes is to a great extent to be disregarded in the effect on the imaging since all particles emitted from an object point are collected in one image point.

The explanations apply both for the design of the second lens L2 as an asymmetric single lens and also as a field lens.

The mask M which comprises the structure to be imaged in the form of holes in a foil (e.g. made from silicium) is illuminated by an ion source Q having an extremely small virtual source size (almost 10 μm) and following thereon illuminating device, which can comprise two multipoles and a mass separator (e.g, ExB filter) disposed between the two multipoles, and where appropriate a diagnosis system. The said mask in a first embodiment according to the present invention, is located between the outer electrodes of the lens G3 consisting of three electrodes R1, R2 and M and having an overall positive refractive power.

In the embodiment of the present invention, as illustrated in FIG. 1a, the lens G3 produces a cross-over region (crossover) C, i.e. a real image of the ion source Q behind its image-side focal point. The object-side focal point of the second collecting lens L2 arranged in front of the wafer W is located approximately at the site of the cross-over C. Thus, all beams leave the collecting lens L2 almost axis parallel and an almost telecentric imaging system is obtained. This has the advantage that the imaging scale in the case of small displacements of the wafer W does not change in the direction of the ionic optic axis.

Figure 8:
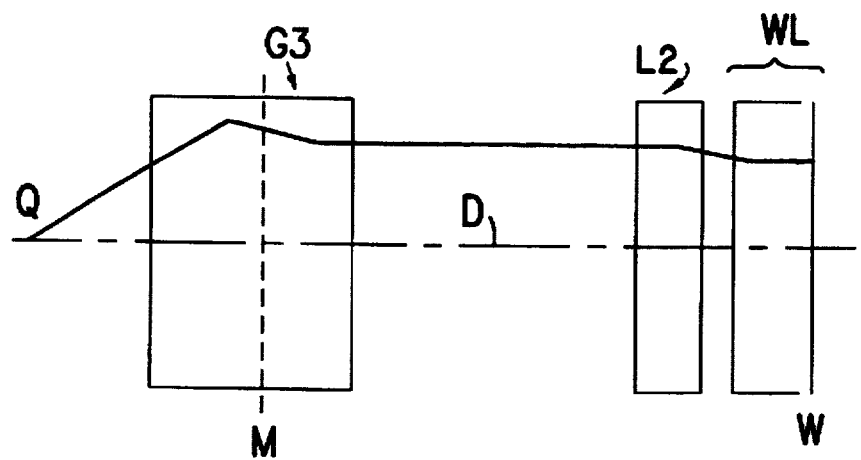
FIG. 8 shows a view analogous with that of FIG. 1b, with correcting lens in front of the wafer.

In another embodiment of the present invention, as shown in FIG. 1b, an image of the mask can also be produced without a cross-over point. In the case of an image reducing in size the telecentricity is lost, wherein extremely small angles (approx. 6 mrad) are still possible at the wafer. In order to regain a telecentric system it is possible in accordance with the present invention to provide a correcting lens WL directly in front of the wafer (as shown in FIG. 8), by means of which the beams impact on the wafer again in an almost axis parallel manner. According to the present invention, this correcting lens can be formed in such a manner that a single substantially tubular electrode is positioned directly in front of the wafer and in comparison therewith comprises a slightly different potential. This electrode forms together with the wafer the so-called wafer lens WL which again comprises a plate, namely the wafer itself, as the electrode and can therefore be operated as a diverging lens. This is then the case when the potential at the electrode lying in front of the wafer is such that the ions are decelerated on the way to the wafer.

In a grating design of the three-electrode lens with grating according to the present invention the distance between the facing ends of the tube electrodes R1, R2 amounts to 135 mm. The electrode formed as the mask M is arranged at a distance of 90 mm from the outlet port of the tube electrode R1, wherein the diameter of the outlet port amounts to 600 mm, whereas the diameter of the inlet port of the tube electrode R2 amounts to 300 mm. The outlet port of the tube electrode R2 is 675 mm away from the electrode formed as the mask M and the inlet port of the tube electrode R1 lies 1350 mm in front of the mask forming the middle electrode. At a distance of 585 mm from the outlet port facing the mask M, the inner diameter of the tube electrode R1 reduces from 600 to 300 mm.

Figure 6:
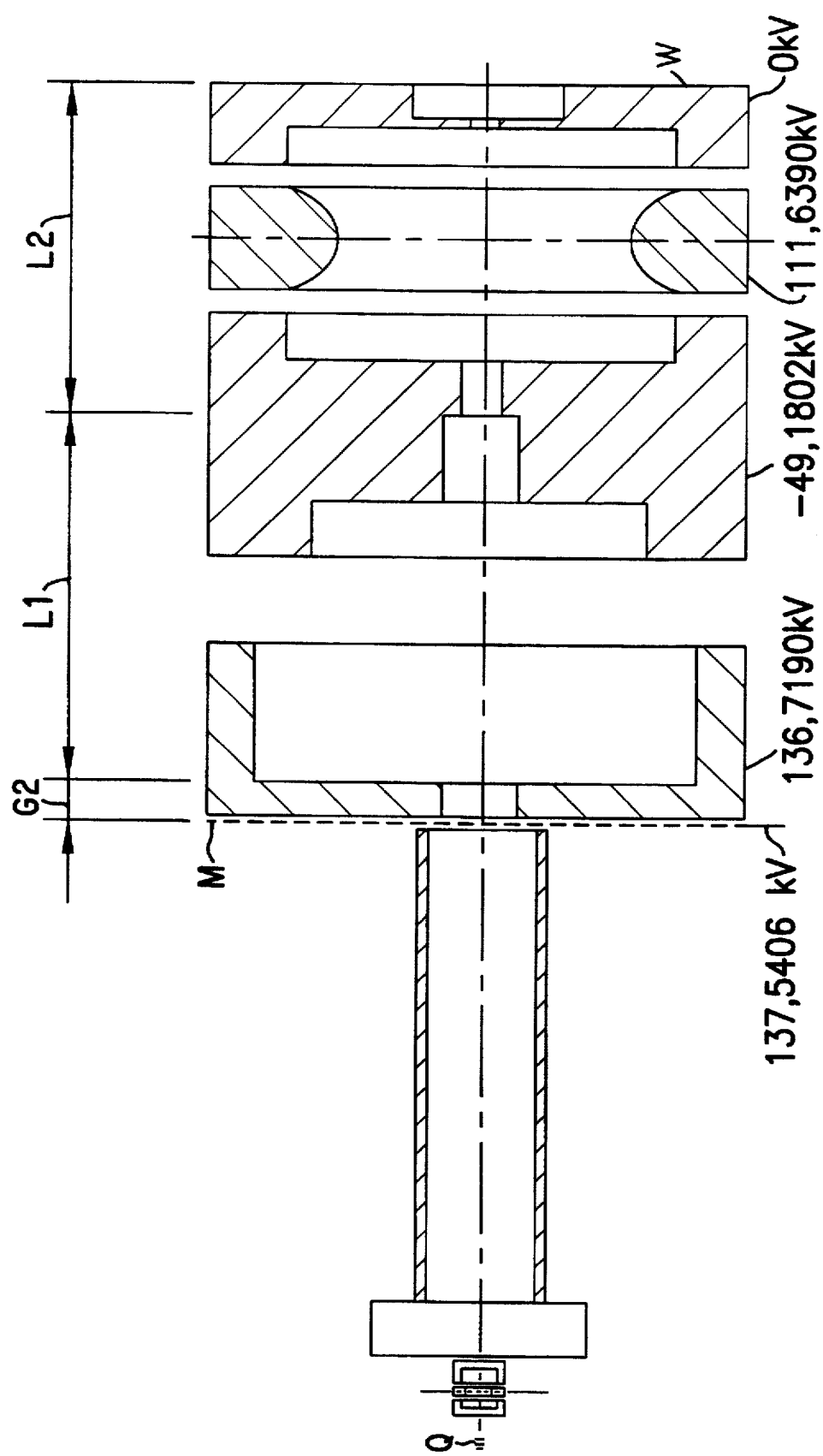
FIG. 6 shows a simplified view of an ion projection device according to the present invention having a two electrode grating lens partially in an axial longitudinal sectional view in which the mask forms the grating electrode.

In the case of another embodiment of the present invention as illustrated in FIG. 6 the mask M forms the first electrode of the diverging grating lens G2. There then follows the collecting lens L1, followed by the second collecting lens L2 which lies in front of the wafer plane in the beam path and is formed as an asymmetrical SINGLE lens. Since the potential of the last electrode of a lens is always the same as that of the first electrode of the following lens, these two electrodes can be formed physically in each case as a single electrode, as can also be seen in FIG. 6. It is therefore possible to regard the entire ionic optic column between the mask and wafer as a single "multi-electrode lens", in this case as a five electrode lens, which comprises different refractive regions, namely G2, L1 and L2. Where appropriate, for example in order to reduce the distance between the source and the wafer, it is also possible to provide an illuminating lens in front of the mask [not illustrated in FIG. 6].

In contrast to the previously described three-electrode lens, in which the mask M forms the middle electrode, in the case of the arrangement as shown in FIG. 6 the field intensities in front of and after the mask are different, so that mini-lens effects (flies eyes lens effects) occur caused by the holes in the mask M. Since, however, the electric field intensity at the plane of mask M which faces the second electrode is extremely low and because the object being imaged is the mask, then the effect of this mini-lens is negligibly small. The low field intensity is desired since owing to the work which must be provided by a foil moving in an electric field, any occurring vibrations of the mask M are avoided. This renders it possible to change and set up the mask M rapidly. The arrangement as shown in FIG. 6 renders it possible to throw the image of mask holes with a telecentricity better than 2 mrad onto the plane of the wafer W. This high telecentricity produces in the plane of the wafer W a sharpness intensity of approximately 10 μm. Therefore in this embodiment of the present invention, it is not only the imaging scale and the resolution which is maintained, even when the wafer changes position in the optical axis, but it is also possible to maintain the particularly small distortion.

In the case of the system as shown in FIG. 6 the ion beam impacts in a 60×60 mm² mask structure field at angles which are less than 1.5° at the edge of the mask field. The mask holes can be achieved in a 3 μm thick silicium foil having a bias for 3°. It is thus possible in a 3 μm thick masking foil to achieve line gratings with a hole width of e.g. 0.45 μm without shadow distortion occurring caused by the mask edges. The distance between the wafer W and the mask M amounts for example to 2171.51 mm and the maximum diameter of 1180 mm.

The devices according to the present invention comprise irrespective of which embodiment the following characteristics:

a) In the case of the arrangements comprising a cross-over the beam of rays generally experience a cushion-shaped residual distortion (region A) by virtue of the collecting lens G3N (FIGS. 1a and 1b) and G2 and L1 (FIG. 2) which follow and/or contain the mask M, which cushion-shaped residual distortion changes after the cross-over to become a barrel-shaped residual distortion (Region B).

Figure 2:
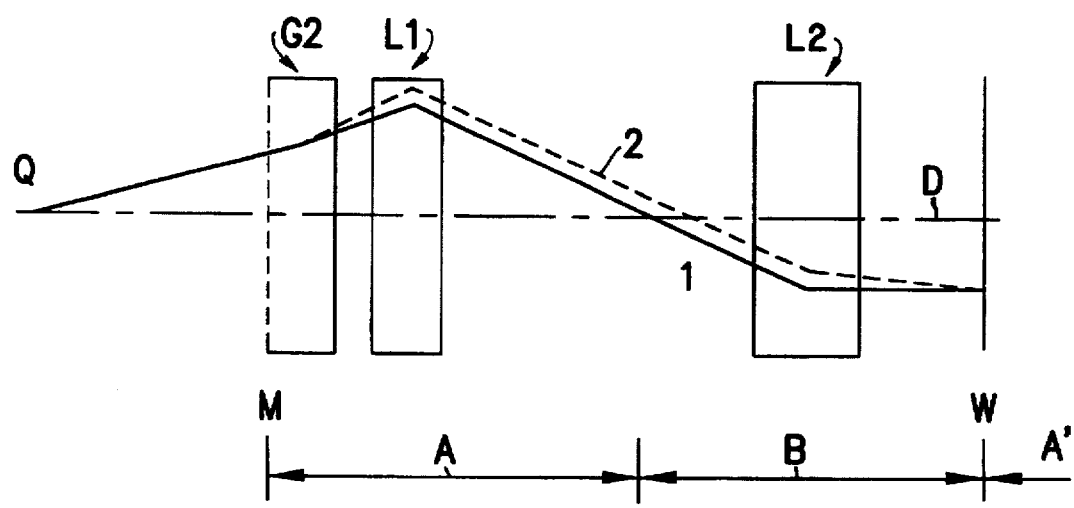
FIG. 2 shows an ion lithography system of a second embodiment of the present invention with distortion correction.

FIGS. 1a and 2 illustrate that by virtue of the distorting effect of the collecting lens L2 disposed in front of the wafer W the beams experience an additional deflection which reduces the region B of a barrel-shaped distortion and generates a region A' of cushion-shaped distortion which is adjacent to the region of a barrel-shaped distortion. Referring to FIG. 1b, in the case of the arrangement without a cross-over the cushion-shaped distortion generated by the collecting lens G3N is reduced by virtue of the lens L2 and finally becomes a barrel-shaped distortion (Region B).

A plane is produced behind the collecting lens L2 arranged in front of the wafer W, in which plane the distortions caused by the lenses lying between the mask and the wafer are compensated (plane of minimal distortion). This, however, only applies for the distortion of the 3rd order, the much smaller distortions of the 5th and 6th order remain, so that the distortion does not completely disappear but rather is merely kept to a significant minimum. When using a wafer lens WL, as described below, this can contribute to a further minimizing of the distortion.

Figure 3A:
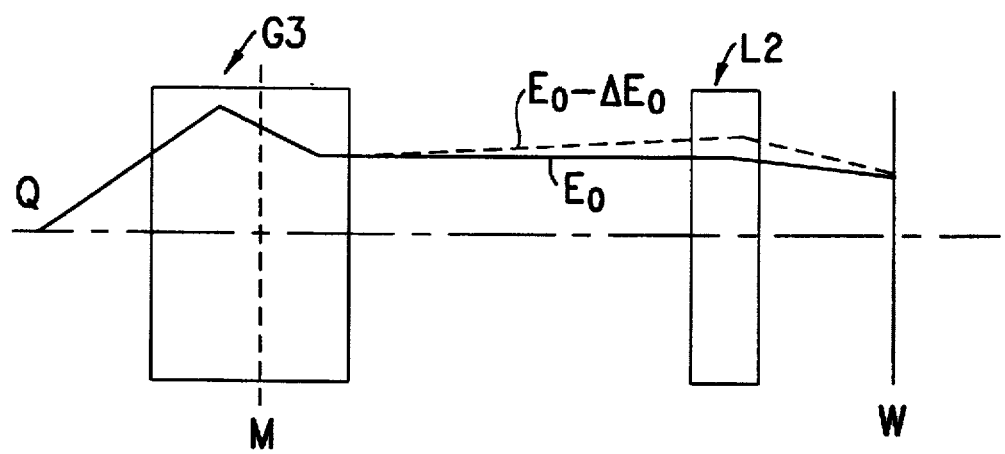
FIG. 3a shows ion lithography systems of the type as shown in FIGS. 1a, 1b and 2 with a correction of the chromatic defect.
Figure 3B:
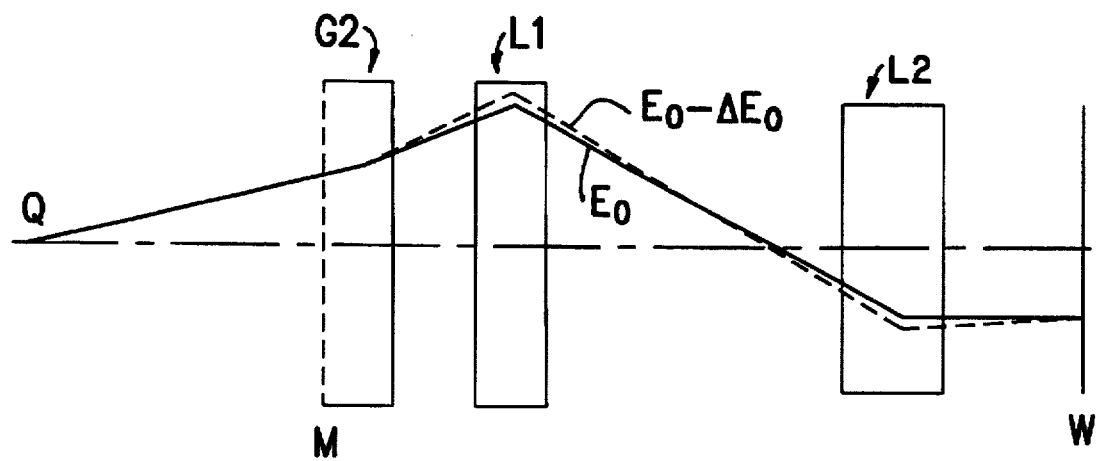
FIG. 3b shows another embodiment of ion lithography systems of the type as shown in FIGS. 1a, 1b and 2 with a correction of the chromatic defect.
Figure 7:
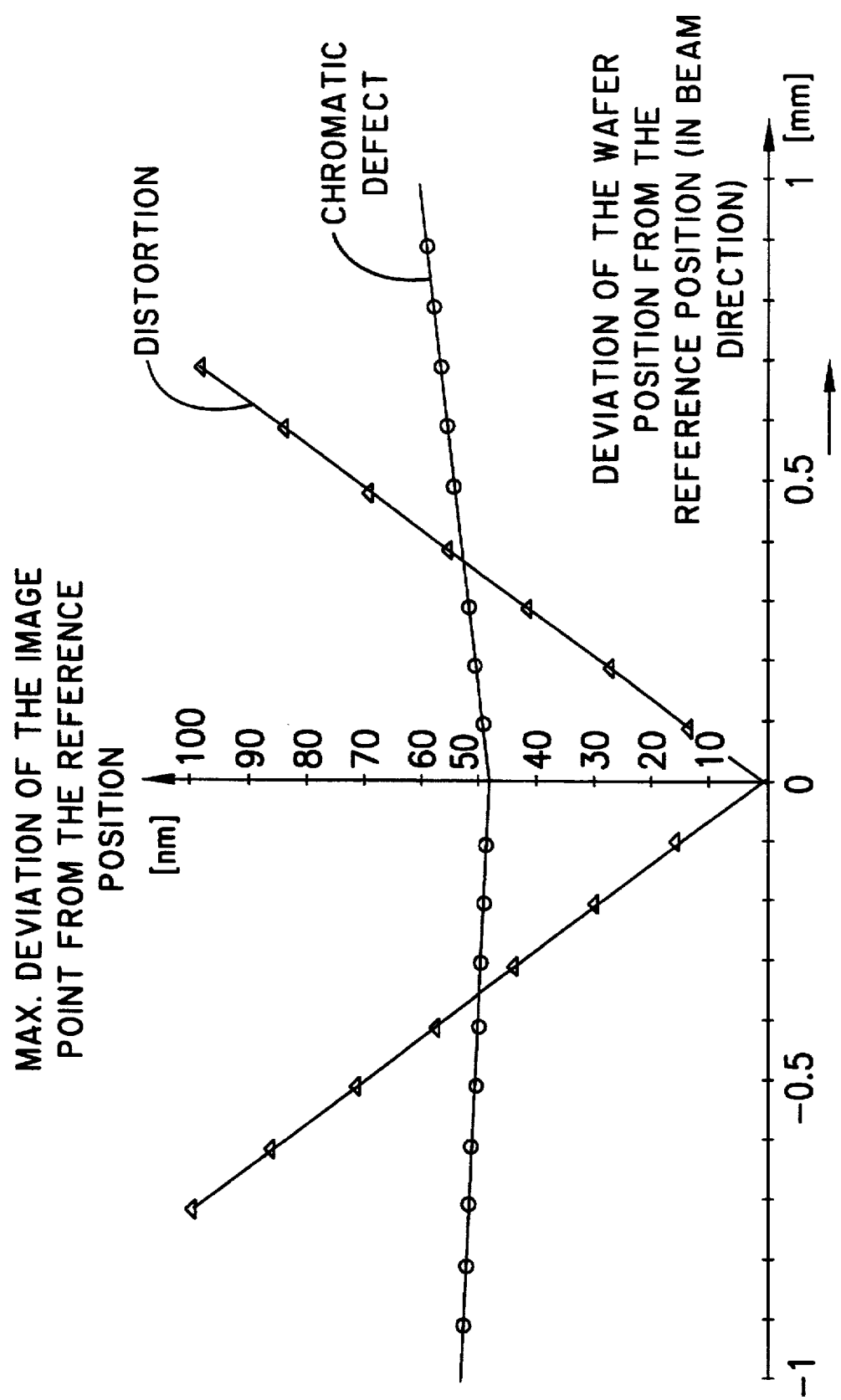
FIG. 7 shows the progression of the chromatic resolution distortion and the distortion in dependence upon the wafer position for an arrangement according to FIG. 6.

The dependence of the residual distortion on the deviation in the beam direction of the wafer position from the desired position in the proposed embodiment of the present invention according to FIG. 6 progress with practically the same increase as in the device described in the European Patent Application No. 93 890 058.6, in which two three electrode grating lenses for the purpose of imaging the holes of, a mask are used (FIG. 7), wherein the distortion minimum is less than in the aforementioned application. Together with the higher telecentricity this leads to a sharpness intensity of approximately 10 μm which is substantially better than the sharpness intensity achievable in a conventional imaging process using light optics. For example, in the case of photolithography using high energy UV light ("deep UV") during the manufacture of structures of 0.2 μm the sharpness intensity is likewise in the region of only some tenths μm. In order to be able to produce integrated circuits with these low sharpness intensities, it is necessary in the case of light optics to level the surface of the wafer and the lithography may only take place in the uppermost layer ("top surface imaging"), which is associated with high costs.

b) In the arrangements as shown in FIGS. 1b and 2, as is evident schematically from FIG. 3a and 3b, a compensation for the chromatic defect is provided by virtue of the effects of the two collecting lenses L1 and L2 for a predetermined image plane E after the second collecting lens arranged in front of the wafer W. A beam (illustrated in FIGS. 3a and 3b with a broken line) having an approximately smaller energy $E_o - \Delta E_o$ than the desired energy $E_o$ is deflected in the lens G3 and G2+L1, which contains the mask M as an electrode, to a greater extent than a beam having the desired energy (illustrated by the continuous line) and as a result thereof meets the lens L2 arranged in front of the wafer W at a greater distance to the axis than the desired beam and is therefore owing to its lower energy deflected back to a greater extent with respect to the optical axis, so that it meets the desired beam in a predetermined distance behind the collecting lens L2 arranged in front of the wafer W. In this plane E the chromatic defect of the 1st order disappears. A residual distortion, the chromatic defect of the 2nd order also remains here, i.e. a distortion proportional to the square of the energy deviation from the desired beam.

In the case of the arrangement as shown in FIG. 1a the wafer lens WL (as shown in FIG. 8) can be used to minimize the chromatic defect.

The three relevant planes, namely the Gaussian image plane of the mask M, the plane of minimal distortion (FIGS. 1a and 1b and 2) and the plane of minimal chromatic defect (FIG. 3a and FIG. 3b) generally do not coincide. By appropriately selecting the lenses and the position of the ion source Q on the ionic optic axis it is, however, possible to achieve that while maintaining the almost parallel beam path the said three planes coincide at the outlet of the lens L2. If then the wafer W is arranged where the three planes coincide, then this has the effect that both the distortion and also the chromatic defect are minimal.

In the case of all the described embodiments comprising a cross-over (FIG. 1a, FIG. 2, FIG. 6) a highest possible particle energy is achieved at the cross-over, which has the advantage that the so-called stochastic space charge effects are minimized. The cross-over lies in all cases in the field free space in front of the lens L2.

Stochastic particle deflections are for example discussed in the article "Stochastic ray deflections in focused particle beams" by A. Weidenhausen, Speer and H.Rose in Optik 69 (1985), pages 126 to 134. The stochastic space charge effect leads to resolution defects during the imaging process, i.e. to a reduction of the maximum achievable resolution of the ionic optic. The intensity of this effect depends among other things on the energy at the cross-over and in fact according to the above article as in accordance with:

$$\delta X \sim E^{5/4}$$

wherein δX represents the deterioration in the resolution and E represents the energy of the ions at the cross-over.

The following table shows the calculation results for the embodiment of an ion projection lithography system in accordance with the present invention as illustrated in FIG. 6.

TABLE 1

| | |
|---|---|
| Distance Source-mask | 1.6 m |
| Distance Mask-wafer | 2.2 m |
| Image field size on the mask | 60 × 60 mm$^2$ |
| Imaging scale (reduction) | 3:1 |
| Voltage ratio at G2 | 1.082 |
| Voltage ratio at L1 | 18.16 |
| Voltage ratio between the first and third electrode from L2 | 0.75 |
| Voltage ratio between the first and second electrode from L2 | 0.1825 |

TABLE 1-continued

| | |
|---|---|
| Maximum distortion* | <10 nm |
| max. chromatic spread | 50 nm** |
| | 20 nm*** |
| max. beam divergence after the lens system | <2 mrad |

*Max. deviation of any image point from the ideal image
**for an energy blurring of ions at the ion source outlet E/E = 0.0003, wherein E represents the energy of the ions at the outlet of the ion source.
***for ion sources, where the ions at the outlet comprise less energy blurring, namely E/E = 0.0001.

Under the above term voltage ratio between two electrodes of one lens with the potentials $U_1$ and $U_2$, the following ratio is to be understood:

$$\frac{(U_2 - U_0)}{(U_1 - U_0)}$$

wherein $U_0$ is the potential at which the kinetic energy of the charged particles would be equal to zero.

What is claimed is:

1. A particle beam imaging system, comprising:
    a masking foil;
    a particle source projecting a representation of a structure onto a wafer along a beam path, the structure being formed on the masking foil and having at least one transparent portion; and
    at least two electrostatic lenses having an optical axis therethrough and being positioned between the wafer and the particle source, a first lens of the at least two electrostatic lenses including a grating lens formed by a first tube electrode and a first plate, the first plate being positioned perpendicular to the optical axis, wherein the masking foil forms the first plate, and wherein the masking foil is positioned downstream of the first electrode in a direction of the beam path.

2. The particle beam imaging system according to claim 1, wherein the particle source is an ion source.

3. The particle beam imaging system according to claim 1, wherein the at least one transparent portion includes a plurality of holes.

4. The particle beam imaging system according to claim 1, wherein the grating lens further includes a second tube electrode.

5. The particle beam imaging system according to claim 1, further comprising:
    an additional lens positioned in the beam path between the masking foil and the wafer, the additional lens including a third tube electrode and a second plate, wherein the wafer forms the second plate and wherein the third tube electrode is positioned directly in front of the wafer.

6. The particle beam imaging system according to claim 1, wherein the at least two electrostatic lenses and the masking foil form a three-electrode grating lens, the masking foil being a middle electrode of the three-electrode grating lens, and wherein a second lens of the at least two electrostatic lenses is an immersion lens formed between the masking foil and the wafer.

7. The particle beam imaging system according to claim 1, wherein the at least two electrostatic lenses and the masking foil form a three-electrode grating lens, the masking foil being a middle electrode of the three-electrode grating lens, and wherein a second lens of the at least two electrostatic lenses is an asymmetric single lens, the asymmetric single lens being formed between the masking foil and the wafer.

8. The particle beam imaging system according to claim 1, wherein the grating lens is a two-electrode grating lens, the masking foil being the first electrode of the two-electrode grating lens, the second lens being formed as a two electrode immersion lens and positioned after the two-electrode grating lens, and further comprising:
    a third lens formed as an asymmetric single lens, the third lens being positioned between the second lens and the wafer.

9. The particle beam imaging system according to claim 1, wherein the particle source projects the structure using a plurality of ion beams, a cross-over point of the plurality of ion beams being positioned in a field-free space.

10. The particle beam imaging system according to claim 9, wherein the plurality of ion beams generate a first energy at the cross-over point and a second energy at a the wafer, the first energy being greater than the second energy.

11. The imaging system according to claim 1, wherein the beam path between the mask and the wafer excludes a cross-over point.

* * * * *